(12) United States Patent
Killat et al.

(10) Patent No.: US 6,362,667 B2
(45) Date of Patent: Mar. 26, 2002

(54) OUTPUT DRIVER CIRCUIT

(75) Inventors: Dirk Killat, Kirchheim; Ordwin Haase, Ottobrunn; Heinz Werker, Huglfing, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/789,981

(22) Filed: Feb. 20, 2001

Related U.S. Application Data

(63) Continuation of application No. PCT/DE99/02389, filed on Aug. 2, 1999.

(51) Int. Cl.[7] ................................. H03B 1/00

(52) U.S. Cl. ...................................... 327/108

(58) Field of Search ................................ 327/108, 110, 327/111, 112, 407; 326/82, 86, 87

(56) References Cited

U.S. PATENT DOCUMENTS

| | | | | |
|---|---|---|---|---|
| 5,250,855 A | * | 10/1993 | Asato | 326/82 |
| 5,825,219 A | * | 10/1998 | Tsai | 327/112 |
| 6,080,205 A | * | 6/2000 | Oshikawa | 327/108 |
| 6,278,306 B1 | * | 8/2001 | Ang et al. | 327/108 |

* cited by examiner

Primary Examiner—Toan Tran
(74) Attorney, Agent, or Firm—Herbert L. Lerner; Laurence A. Greenberg; Werner H. Stemer

(57) ABSTRACT

The output driver circuit of an integrated circuit has several pairs of driver circuits and driver control circuits as well as a control device. Each pair of driver control circuit and driver circuit forms a driver stage. The driver stages are connected in series. Based on the input signal of the output driver circuit, the control device switches the signal direction through the succession of driver stages in such a way that, at the time the output driver circuit is switched either on or off, the driver stages are switched in a time delayed manner, whereby current pulses on the feeding lines and disturbance voltages induced in inductive loads are reduced.

8 Claims, 3 Drawing Sheets

OUTPUT DRIVER CIRCUIT

CROSS-REFERENCE TO RELATED APPLICATION

This is a continuation of International Application PCT/DE99/02389, filed Aug. 2, 1999, which designated the United States.

BACKGROUND OF THE INVENTION

Field of the Invention

The invention relates to an output driver circuit of an integrated circuit having an input terminal for receiving an input signal, at least one output terminal for outputting an output signal, and also a multiplicity of driver stages. Each driver stage has a driver circuit and a driver activation configuration and an activation signal of the driver activation configuration activating the driver circuit. The invention also pertains to a differential output driver circuit with two of the aforementioned output drivers.

Output driver circuits are used for driving the module connections (pins) in integrated circuits. On account of continually increasing operating frequencies of integrated, digital circuits, the rise and fall times of the control signals which activate the output driver circuits are becoming shorter and shorter. As a result of the high switching frequencies of the digital circuit sections, high-frequency current pulses occur on the supply lines. Particularly in the case of output driver circuits which have to supply high currents for driving inductive, resistive or capacitive loads, these undesirable current pulses on the supply lines can reach considerable values and thus interfere with the functioning of other circuit sections. In the case of inductive loads, moreover, abrupt changes in the current profile produce high voltage amplitudes which can electromagnetically undesirably influence the functioning of other circuit sections.

In order to reduce such interference, attempts are made, in the context of switching output driver circuits, to reduce abrupt changes in the current profile of the output driver circuits and also current pulses on the supply lines. For this purpose, it is known for the large driver transistors of an output driver circuit with the associated activation configurations to be divided into chains of smaller driver transistors, so-called driver stages, and for the individual driver stages of the chain to be activated in a manner staggered over time. As a result, although the rise times of the output signals are lengthened, current pulses and induced interference voltages are reduced.

European patent EP 0 340 731 B1 describes an output driver circuit in which a multiplicity of driver stages are connected in parallel and are activated in a manner staggered over time by RC elements connected upstream of the driver stages. The RC elements are formed by resistors connected upstream of the driver transistors and the gate-source capacitance of the individual driver transistors. In this case, each driver transistor is assigned a specific delay time, which can be set through different values of R or C. However, the realization of resistors on integrated circuits has the disadvantage that the area requirement is high and the absolute value of the resistor is poorly adjustable.

U.S. Pat. No. 4,992,676 discloses an output driver circuit in which the individual driver stages are connected up to form a chain. In that case, each driver stage of the chain is respectively activated by a preceding driver stage. In this case, a delay is effected by the signal propagation time through the respective stage preceding a stage. However, the switching-off of the output driver circuit is effected in parallel and simultaneously for all the driver stages and thus leads to an abrupt change in the current profile and, for example in the case of a connected inductor, to an induced interference voltage.

A further output driver circuit, in which an RC element is provided between a first and a second driver stage in order to reduce current and voltage spikes during changeover operations, is disclosed in U.S. Pat. No. 5,355,029. In this case, however, the switching-off of the driver transistors is likewise effected in parallel and simultaneously, as a result of which the above-described disadvantages during the switching-off process are not eliminated.

SUMMARY OF THE INVENTION

It is accordingly an object of the invention to provide an output driver circuit, which overcomes the above-mentioned disadvantages of the heretofore-known devices and methods of this general type and which provides a time delay between the driver stages both during the switching-on and during the switching-off of the driver transistors.

With the foregoing and other objects in view there is provided, in accordance with the invention, an output driver circuit of an integrated circuit, comprising: an input terminal for receiving an input signal; at least one output terminal for outputting an output signal; and a multiplicity of driver stages each having a driver circuit and a driver activation configuration outputting an activation signal for activating the driver circuit;

each the driver activation configuration having a first input and a second input respectively activated in dependence on a changeover signal;

the driver activation configurations being cascaded in series with a first driver activation configuration and a last driver activation configuration, wherein, proceeding from the first driver activation configuration, the activation signal of each the driver activation configuration is fed to the first input of each subsequent the driver activation configuration and, proceeding from the last driver activation configuration, the output signal of each the driver activation configuration is fed to the second input of each preceding the driver activation configuration;

a control device connected to and transmitting the changeover signal to each driver activation configuration via a changeover line;

an input line connected to the control device, the first input of the first driver activation configuration and the second input of the last driver activation configuration being connected to the control device via the input line, the input line carrying a delayed input signal by comparison with the input terminal; and the control device changing over between the first and second inputs of each the driver activation configuration.

In accordance with an added feature of the invention, the driver circuits are defined with different current driver capabilities. The embodiment in which the driver circuits have different current driver capabilities is particularly preferred. In this case, by way of example, the current driver capability may rise from the first up to the last driver stage. The driver circuit of the first driver stage then advantageously carries a lower current density than the driver circuit of the last driver stage. Effects such as, for example, electromigration on account of excessively high current densities in lines are thereby attenuated.

In accordance with an additional feature of the invention, each driver activation configuration has a multiplicity of switches connected in parallel, at least one inverter circuit, and at least one capacitor. The driver activation configuration in this embodiment has at least one inverter circuit and a multiplicity of switches and can be realized in a simple manner using components appertaining to digital circuitry. For the signal delay in a single driver activation configuration, at least one capacitor is provided, which serves for the signal delay in addition to the inverter circuits. The capacitors advantageously lengthen the signal propagation time through the driver activation configurations, so that it is possible to lengthen the rise and fall time in the voltage and current profile.

In accordance with another feature of the invention, the switches in the driver activation configuration are transistors.

In accordance with a further feature of the invention, each driver activation configuration has an output for additionally outputting an inverted activation signal.

In accordance with again a further feature of the invention, each driver circuit receives the activation signal and the complementary activation signal.

In accordance with a concomitant feature of the invention, which is particularly preferred, the output driver circuit is embodied in CMOS technology. What is particularly advantageous in this embodiment is that the switches of the output driver circuit can be realized by individual p-channel and n-channel MOS transistors.

One embodiment of the output driver circuit has a multiplicity of pairwise driver activation configurations and driver circuits and also a control device. In each pair, a driver activation configuration is connected to a driver circuit and the driver activation configurations are connected in series, with a driver activation configuration at the start and one at the end of the series. The control device evaluates the input signal of the output driver circuit and changes over the signal propagation direction through the series of driver activation configurations in a manner dependent on the result of the evaluation. To that end, the input signal is passed both to the first and to the last driver activation configuration. The input signal propagates from the first to the last driver stage when the output driver stage is switched on, and from the last driver stage to the first upon switch-off. On account of the signal propagation time through a single driver stage, a delay is produced during switching. As a result, in an advantageous manner, delayed switching-on and delayed switching-off of the driver stages are achieved and interference voltages induced in inductive loads and current pulses on the supply lines are reduced.

With the above and other objects in view there is also provided, in accordance with the invention, a differential output driver circuit which comprising a first and a second output driver circuit according to the above-outlined invention. The outputs of the first output driver circuit are cross-coupled to the outputs of the second output driver circuit.

This embodiment proves to be particularly advantageous for driving inductive loads such as, for example, transformers since induced voltages are reduced by delayed switching-on and switching-off of the output signals and, as a result, the output terminals of the differential output driver circuit are loaded to a lesser extent. Moreover, electromagnetic interference due to induced voltage spikes are reduced. A further advantage of the delayed switching-on and -off of the driver circuits is manifested in a reduced common-mode voltage. The setting time of transmitter and receiver is thereby reduced.

Other features which are considered as characteristic for the invention are set forth in the appended claims.

Although the invention is illustrated and described herein as embodied in an output driver circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
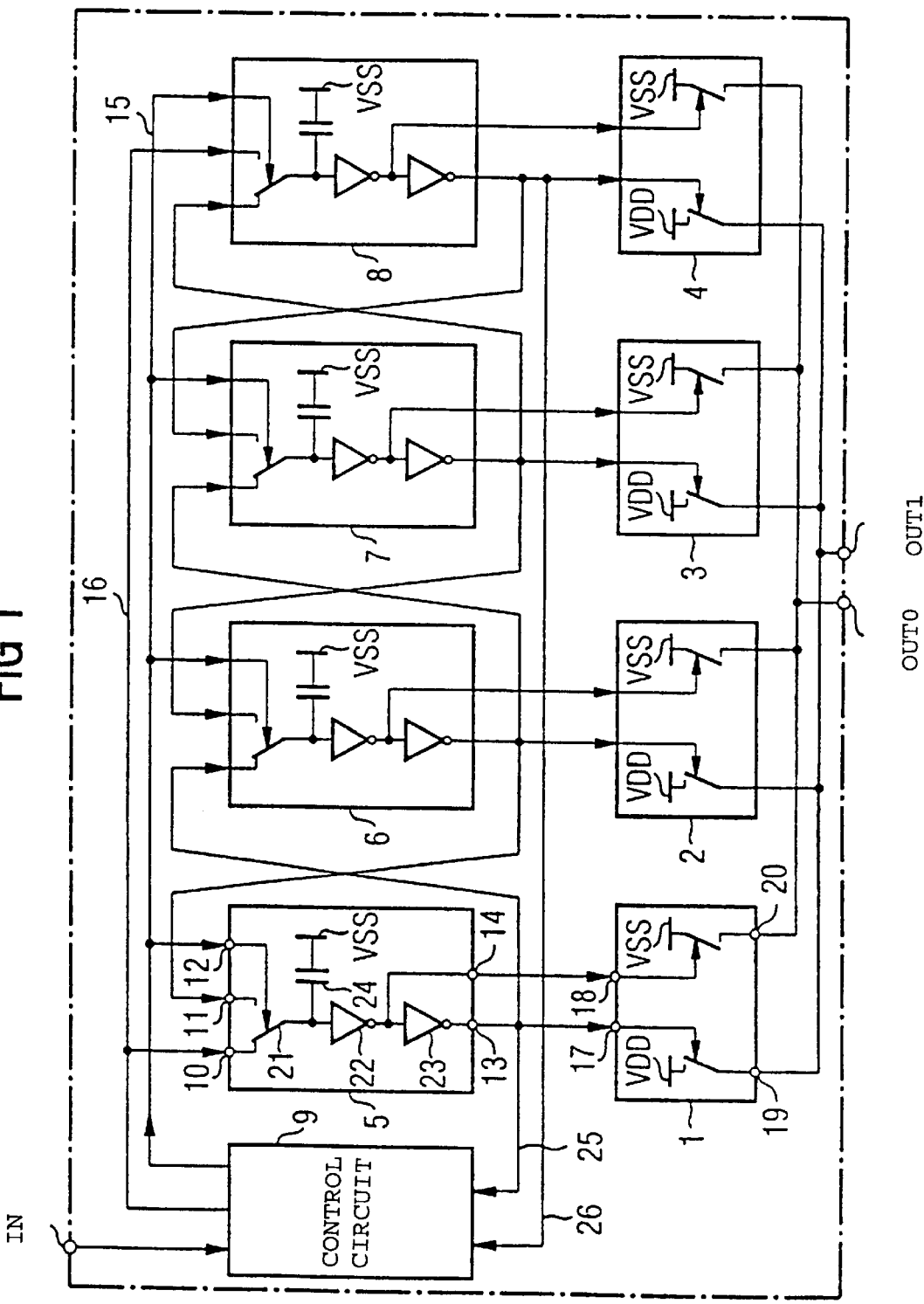
FIG. 1 is a schematic circuit diagram of an exemplary embodiment of the output driver circuit according to the invention.

Referring now to the figures of the drawing in detail and first, particularly, to FIG. 1 thereof, there is shown an output driver circuit having a digital input IN and two outputs OUT0 and OUT1. The output OUT0 can be switched off or switched to the second supply voltage VSS of the output driver circuit. In digital circuitry, VSS is often identical to the zero potential. As is known, such an output is also referred to as pull-down output. The output OUT1 can likewise be switched off or switched to the first supply voltage VDD of the output driver circuit. If VDD is identical to the high potential in digital circuitry, the output, as is known, is also referred to as pull-up output.

The output driver circuit has four driver circuits 1, 2, 3 and 4, each having two inputs 17 and 18 and two outputs 19 and 20. The output 19 of each driver circuit is connected to the output OUT1 and the output 20 is connected to the output OUT0. In the exemplary embodiment illustrated, each driver circuit has two switches, a first switch connecting the output 19 to the first supply voltage VDD and a second switch connecting the output 20 to the second supply voltage VSS. The first switch is digitally activated via the input 17 and the second switch via the input 18 of the driver circuit, both switches being switched on and off by logic states. Preferably, the first switch is closed in the case of a logic zero at the input 17, whereas the second switch is closed by a logic one at the input 18.

The driver circuits are connected pairwise to driver activation configurations 5, 6, 7 and 8 to form a driver stage, in each case the output 13 of a driver activation configuration being connected to the input 17 of a driver circuit and the output 14 of a driver activation configuration being connected to the input 18 of a driver circuit. Each driver activation configuration has two inverter circuits 22 and 23, a capacitor 24 and a changeover switch 21. The inverter circuits in combination with the capacitor 24 serve for the signal delay in the driver activation configuration, it being possible for the signal delay to be increased by further capacitors and inverter circuits. In this case, the dimensioning of the inverter circuits, in particular of the driver capability, is coordinated with the respective driver circuit to be activated, so that the time delay during the switching of the driver circuit to be activated is identical for each driver stage. The changeover switch, which is controlled via the changeover input 12 of the driver activation configuration, changes over between the input 10 and the input 11 of the driver activation configuration. Consequently, one of the two inputs 10 and 11 is reciprocally connected to the input of the first inverter 22.

The driver activation configurations are connected in series, the first input 10 of the first driver activation configuration 5 and the second input 11 of the last driver activation configuration 8 of the series being connected to a control device 9 via a line 16. The changeover input 12 of each driver activation configuration is connected to the control device via a line 15. In addition, the first output of the first driver activation configuration 5 and last driver activation configuration 8, respectively, is connected to the control device via a line 25 and 26, respectively. Proceeding from the first driver activation configuration 5, each driver activation configuration 6 to 8 is connected to the respective succeeding driver activation configuration in such a way that the first output 13 of a driver activation configuration is connected to the first input 10 of the succeeding driver activation configuration. Proceeding from the last driver activation configuration 8, the first output 13 of each driver activation configuration is connected to the second input 11 of the respectively preceding driver activation configuration. The control device is connected to the input IN of the output driver circuit.

The function of the output driver circuit is described below. If a logic one is present at the digital input IN then the pull-up output OUT1 and the pull-down output OUT0 are to be switched on. The control device changes over the signal propagation direction through the series of driver activation configurations in a manner dependent on the input signal IN. When the two outputs OUT0 and OUT1 are switched on, a changeover is made in each case to the first input of each driver activation configuration, so that the input signal traverses all the driver activation configurations of the series through the first driver activation configuration 5, the second driver activation configuration 6 up to the last driver activation configuration 8. As a result, the driver circuits are switched on in a manner staggered over time and the current driver capability at the output OUT0 and OUT1 slowly rises in a stepwise manner. A sudden voltage change in a connected inductor on account of a rapid current change, with the disadvantages outlined in the introduction to the description, is thus reduced. If the input signal is then switched to logic zero, both outputs OUT0 and OUT1 are to be switched off. For this purpose, the control device changes over in each case to the second inputs of each driver activation configuration, so that firstly the last driver activation configuration 8 switches, then the penultimate driver activation configuration 7 and finally the first driver activation configuration 5. In this case, the output stages are switched off in a manner staggered over time and the current driver capability slowly decreases at the outputs.

Figure 2A:
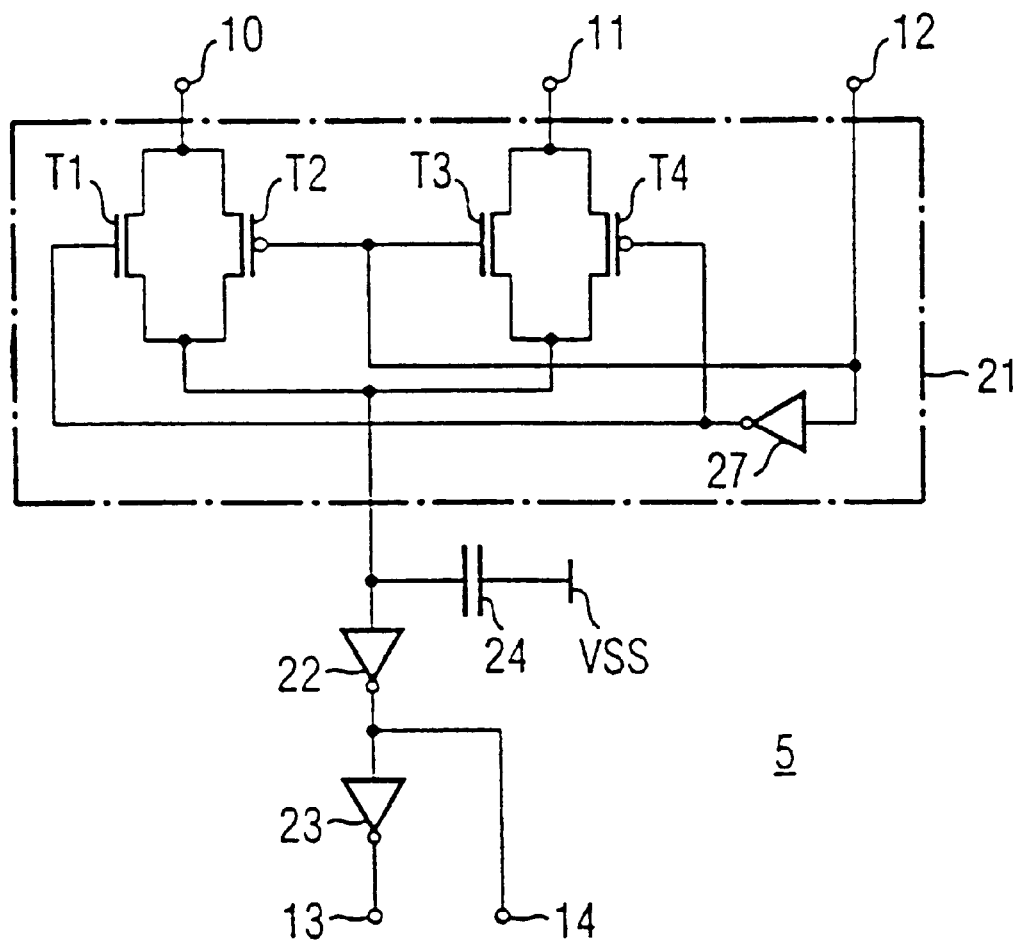
FIG. 2A is a schematic circuit diagram of an exemplary embodiment of a driver activation configuration.

FIG. 2A illustrates an exemplary embodiment of the driver activation configuration using CMOS circuitry. In this example, the changeover switch 21 is realized by transistors T1, T2, T3 and T4 which are connected up to form so-called transfer or transmission gates. The transfer gate formed by the transistors T1 and T2 switches the first input 10 and the transfer gate formed by the transistors T3 and T4 switches the second input 11. The changeover input 12 is connected to the control terminals of the transistors T2 and T3 and, via an inverter 27, to the control terminals of the transistors T1 and T4. The outputs of both transfer gates are connected to the input of a first inverter 22 and a capacitor 24. A second inverter 23, whose output forms the first, non-inverted output 13 of the driver activation configuration, is connected to the first inverter. The second, inverted output 14 of the driver activation configuration is connected to the output of the first inverter 22. The capacitor 23 and the first and second inverters delay the activation signal for the driver circuit which is activated via the outputs 13 and 14. The propagation time of the activation signal and thus the switch-on and -off delay of the driver circuit connected to the driver activation configuration can be set depending on the choice of capacitor and inverters.

Figure 2B:
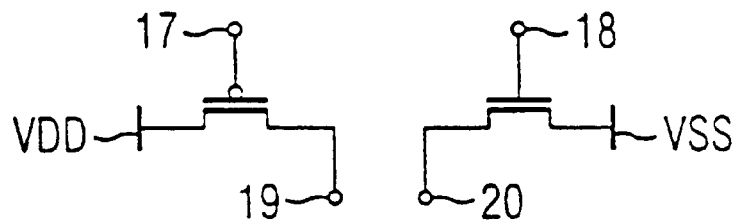
FIG. 2B is circuit diagram of an exemplary embodiment of a driver circuit.

FIG. 2B shows an exemplary embodiment of the driver circuit having, as switches, two MOS transistors using CMOS technology, the load path of the p-channel MOSFET being connected between the first supply voltage VDD and the output 19 and the load path of the n-channel MOSFET being connected between the second supply voltage VSS and the output 20.

Figure 3:
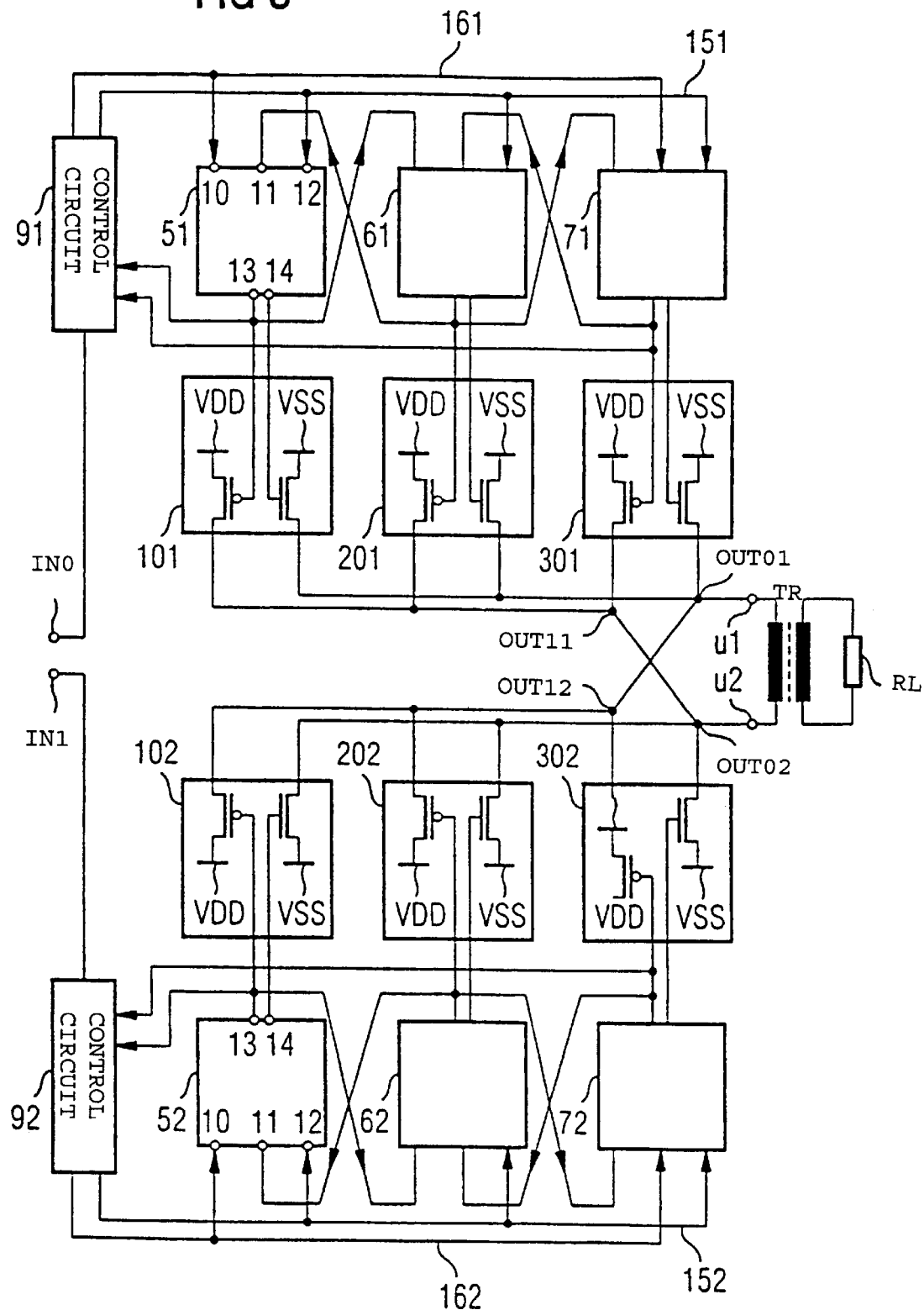
FIG. 3 is a schematic circuit diagram of a combination of two output driver circuits to form an output driver circuit for the digital signal transmission.

FIG. 3 shows a combination of two output driver circuits, a first output driver circuit having a control device 91, three driver activation configurations 51, 61 and 71 and three driver circuits 101, 201 and 301. Such an arrangement is used for example in a UPN transmitter with differential outputs, which is used in ISDN modules, for activating transformers. A second output driver circuit has a control device 92, three driver circuits 52, 62 and 72 and also three driver circuits 102, 202 and 302. The control device 91 and 92 changes over the inputs of the driver activation configurations 51, 61, 71 and 52, 62, 72, respectively, via the line 151 and 152, respectively. The line 161 and 162, respectively, in turn connects the first input of the first driver activation configuration 51 and 51, respectively, and the second input of the last driver activation configuration 71 and 72, respectively, to the control device 91 and 92, respectively. The pull-up output OUT11 of the first output driver circuit is connected to the pull-down output OUT02 of the second output driver circuit and to the terminal U2 of a transformer TR. The pull-down output OUT01 of the first output driver circuit is connected to the pull-up output OUT12 of the second output driver circuit and to the terminal U1 of the transformer TR. On its secondary side, the transformer is connected to a load resistor RL. Through the application of different input signal combinations, the transformer TR can then be driven by the two output driver circuits. In this case, the following input signal combinations (IN0, IN1) lead to the corresponding voltages at the terminals (U1, U2) of the transformer ("off" means that the output is switched off and the potential at this output is indefinite):

| (IN0, IN1) | (OUT01, OUT12) | (OUT02, OUT11) | (U1, U2) |
|---|---|---|---|
| (1, 1) | (VSS, VDD) | (VSS, VDD) | forbidden state |
| (1, 0) | (VSS, off) | (off, VDD) | (VSS, VDD) |
| (0, 1) | (off, VDD) | (VSS, off) | (VDD, VSS) |
| (0, 0) | (off, off) | (off, off) | (off, off) |

The input signal combination (1, 1) is forbidden since, in this case, all the switches are closed and the first VDD and second VSS supply voltage are short-circuited. In this case, the driver circuits can be damaged by a high current flowing via the switches. With the input signal combination (0, 0), the outputs are completely switched off, with the result that the potential at the terminals U1 and U2 of the transformer is indefinite. In this state, no current flows through the driver circuits. By virtue of the fact that during the transition from the input signal combination (1, 0) to (0, 1) or (0, 1) to (1, 0), the driver circuits 101, 201, 301 and 102, 202, 302 are switched on or off, respectively, in a manner staggered over time, a common-mode pulse during the switching-on process and a common-mode voltage during the switching-off process on the primary side of the transformer are distinctly reduced.

Moreover, as a result of the driver circuits being switched off in a manner staggered over time, an excessive voltage increase induced in the transformer is reduced and, as a result, the electromagnetic behavior of the circuit is improved.

The driver circuits usually have different current driver capabilities. In this case, the driver circuit 101, 102 connected to the first driver activation configuration 51, 52 has a lower current driver capability than the driver circuit 301, 302 connected to the last driver activation configuration 71, 72. When the driver circuits are switched on or off, the weakest 101, 102 or strongest 301, 302 driver circuit, respectively, is then first switched on or off, respectively. This measure additionally reduces a voltage induced in the transformer when the driver circuits are switched on or off. Moreover, this prevents the first driver stages 101, 102 from carrying, during the switching-on process, a very high current density which can promote electromigration in the transistors and lines of the driver circuit of the first driver stage.

The control devices 91, 92 have logic elements for evaluating the input signals, which generate a changeover signal which, via the lines 151, 152, change over the signal propagation direction through the series of driver activation configurations. It is necessary merely to evaluate the input combination described in the previous table and to derive from this signals for switching over the two inputs 10 and 11 of the driver activation configurations. This can be performed for example by a simple switching network merely comprising logic gates.

We claim:

1. An output driver circuit of an integrated circuit, comprising:
    an input terminal for receiving an input signal;
    at least one output terminal for outputting an output signal; and
    a multiplicity of driver stages each having a driver circuit and a driver activation configuration outputting an activation signal for activating said driver circuit;
    each said driver activation configuration having a first input and a second input respectively activated in dependence on a changeover signal;
    said driver activation configurations being cascaded in series with a first driver activation configuration and a last driver activation configuration, wherein, proceeding from said first driver activation configuration, the activation signal of each said driver activation configuration is fed to said first input of each subsequent said driver activation configuration and, proceeding from said last driver activation configuration, the output signal of each said driver activation configuration is fed to said second input of each preceding said driver activation configuration;
    a control device connected to and transmitting the changeover signal to each driver activation configuration via a changeover line;
    an input line connected to said control device, said first input of said first driver activation configuration and said second input of said last driver activation configuration being connected to said control device via said input line, said input line carrying a delayed input signal by comparison with said input terminal; and
    said control device changing over between said first and second inputs of each said driver activation configuration.

2. The output driver circuit according to claim 1, wherein said driver circuits are defined with different current driver capabilities.

3. The output driver circuit according to claim 1, wherein each said driver activation configuration has a multiplicity of switches connected in parallel, at least one inverter circuit, and at least one capacitor.

4. The output driver circuit according to claim 1, wherein said switches in said driver activation configuration are transistors.

5. The output driver circuit according to claim 1, wherein each said driver activation configuration has an output for additionally outputting an inverted activation signal.

6. The output driver circuit according to claim 5, wherein each said driver circuit receives the activation signal and the complementary activation signal.

7. The output driver circuit according to claim 1 embodied in CMOS technology.

8. A differential output driver circuit, comprising a first output driver circuit according to claim 1 and a second output driver circuit according to claim 1, said outputs of said first output driver circuit being cross-coupled to said outputs of said second output driver circuit.

* * * * *

UNITED STATES PATENT AND TRADEMARK OFFICE
CERTIFICATE OF CORRECTION

PATENT NO. : 6,362,667 B2
DATED : March 26, 2002
INVENTOR(S) : Dirk Killat et al.

It is certified that error appears in the above-identified patent and that said Letters Patent is hereby corrected as shown below:

<u>Title page,</u>
Item [30], should read as follows:

-- Aug. 18, 1998      (DE) .......... 198 37 394.5 --

Signed and Sealed this

Twenty-seventh Day of August, 2002

Attest:

Attesting Officer

JAMES E. ROGAN
*Director of the United States Patent and Trademark Office*